(12) United States Patent
Chang-Wook et al.

(10) Patent No.: US 7,940,552 B2
(45) Date of Patent: May 10, 2011

(54) MULTIPLE LEVEL CELL PHASE-CHANGE MEMORY DEVICE HAVING PRE-READING OPERATION RESISTANCE DRIFT RECOVERY, MEMORY SYSTEMS EMPLOYING SUCH DEVICES AND METHODS OF READING MEMORY DEVICES

(75) Inventors: Jeong Chang-Wook, Seoul (KR); Gi-Tae Jeong, Seoul (KR); Hyeong-Jun Kim, Seoul (KR); Seung-Pil Ko, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 526 days.

(21) Appl. No.: 12/079,869

(22) Filed: Mar. 28, 2008

(65) Prior Publication Data
US 2008/0266942 A1    Oct. 30, 2008

(30) Foreign Application Priority Data

Apr. 30, 2007  (KR) .................. 10-2007-0042046
Mar. 17, 2008  (KR) .................. 10-2008-0024517

(51) Int. Cl.
*G11C 11/00*    (2006.01)
(52) U.S. Cl. .................. 365/163; 365/148; 977/754
(58) Field of Classification Search .................. 365/46, 365/94, 100, 113, 129, 148, 163; 257/2–5, 257/9, 296, E31.047, E27.006; 438/29, 95, 438/96, 166, 259, 365, 482, 486, 597; 977/754
See application file for complete search history.

(56) References Cited

U.S. PATENT DOCUMENTS

| 5,912,839 | A  | * | 6/1999  | Ovshinsky et al. ...... 365/185.03 |
| 6,503,829 | B2 |   | 1/2003  | Kim et al. |
| 6,625,054 | B2 |   | 9/2003  | Lowrey et al. |
| 6,813,177 | B2 | * | 11/2004 | Lowrey et al. ................ 365/148 |

(Continued)

FOREIGN PATENT DOCUMENTS

JP    2006-004480    1/2006

(Continued)

OTHER PUBLICATIONS

A. Pirovano, et al., "Low-Field Amorphous State Resistance and Threshold . . . ," IEEE Transactions on Electron Devices, vol. 51, No. 5., pp. 714-719, May 2004.

(Continued)

*Primary Examiner* — Richard Elms
*Assistant Examiner* — Harry W Byrne
(74) *Attorney, Agent, or Firm* — Mills & Onello, LLP

(57) ABSTRACT

A memory device comprises a plurality of memory cells, each memory cell comprising a memory cell material that has an initial resistance that is determined in response to an applied programming current in a programming operation, the resistance of the memory cell varying from the initial resistance over a time period following the programming operation, and each memory cell being connected to a conduction line of the memory device that is used to apply the programming current to program the resistance of the corresponding memory cell in the programming operation and that is used to apply a read current to read the resistance of the corresponding memory cell in a read operation. A modification circuit modifies the resistance of a memory cell of the plurality of memory cells selected for a read operation to return its resistance to near the initial resistance prior to a read operation of the memory cell.

11 Claims, 15 Drawing Sheets

U.S. PATENT DOCUMENTS

| | | |
|---|---|---|
| 6,928,022 B2 | 8/2005 | Cho et al. |
| 6,967,865 B2 | 11/2005 | Lee |
| 6,982,913 B2 | 1/2006 | Oh et al. |
| 7,012,834 B2 | 3/2006 | Cho et al. |
| 7,027,342 B2 | 4/2006 | Inoue |
| 7,085,154 B2 | 8/2006 | Cho et al. |
| 2004/0114419 A1 | 6/2004 | Lowrey et al. |
| 2004/0246804 A1 | 12/2004 | Cho et al. |
| 2004/0246808 A1 | 12/2004 | Cho et al. |
| 2005/0052904 A1 | 3/2005 | Cho et al. |
| 2005/0068804 A1 | 3/2005 | Choi et al. |
| 2005/0117388 A1 | 6/2005 | Cho et al. |
| 2005/0174841 A1 | 8/2005 | Ho |
| 2005/0276138 A1 | 12/2005 | Inoue |
| 2006/0011902 A1 | 1/2006 | Song et al. |
| 2006/0013058 A1 | 1/2006 | Kang et al. |
| 2006/0046509 A1 | 3/2006 | Gwan-Hyeob |
| 2006/0050548 A1 | 3/2006 | Oh et al. |
| 2006/0076548 A1 | 4/2006 | Park et al. |
| 2006/0092694 A1 | 5/2006 | Choi et al. |
| 2006/0118913 A1 | 6/2006 | Yi et al. |
| 2006/0120148 A1 | 6/2006 | Kim et al. |
| 2006/0138393 A1 | 6/2006 | Seo et al. |
| 2006/0152186 A1 | 7/2006 | Suh et al. |
| 2006/0180803 A1 | 8/2006 | Suh et al. |
| 2006/0180811 A1 | 8/2006 | Lee et al. |
| 2006/0181932 A1 | 8/2006 | Cho et al. |
| 2006/0186483 A1 | 8/2006 | Cho et al. |
| 2006/0192193 A1 | 8/2006 | Lee et al. |
| 2006/0226411 A1 | 10/2006 | Lee |
| 2006/0250885 A1 | 11/2006 | Cho et al. |
| 2006/0266993 A1 | 11/2006 | Suh et al. |
| 2007/0008774 A1 | 1/2007 | Khang |
| 2007/0012906 A1 | 1/2007 | Kim et al. |
| 2007/0018157 A1 | 1/2007 | Hideki |
| 2007/0020799 A1 | 1/2007 | Choi et al. |
| 2007/0029606 A1 | 2/2007 | Noh et al. |
| 2007/0030025 A1 | 2/2007 | Lim et al. |
| 2007/0051935 A1 | 3/2007 | Lee et al. |
| 2007/0054493 A1 | 3/2007 | Nam |
| 2007/0080384 A1 | 4/2007 | Noh et al. |
| 2007/0108433 A1 | 5/2007 | Lee et al. |
| 2007/0108488 A1 | 5/2007 | Suh et al. |
| 2007/0133270 A1 | 6/2007 | Jeong et al. |
| 2007/0148933 A1 | 6/2007 | Lee et al. |
| 2007/0152754 A1 | 7/2007 | Khang et al. |
| 2007/0153570 A1 | 7/2007 | Suh et al. |
| 2007/0160760 A1 | 7/2007 | Shin et al. |
| 2007/0170881 A1 | 7/2007 | Noh et al. |
| 2007/0184613 A1 | 8/2007 | Kim et al. |
| 2007/0185712 A1 | 8/2007 | Jeong et al. |
| 2007/0189065 A1 | 8/2007 | Suh et al. |
| 2007/0194294 A1 | 8/2007 | Song et al. |
| 2007/0200108 A1 | 8/2007 | Noh et al. |

FOREIGN PATENT DOCUMENTS

| | | |
|---|---|---|
| JP | 2006-510153 | 3/2006 |
| KR | 10-2004-0075033 | 8/2004 |
| KR | 10-0642084 | 10/2006 |
| KR | 10-06474533 | 1/2007 |
| WO | WO 2004/055827 A1 | 7/2004 |

OTHER PUBLICATIONS

D. Ielmini, et al., "Recovery and Drift Dynamics of Resistance . . . ," IEEE Transactions on Electron Devices, vol. 54, No. 2, pp. 308-315, Feb. 2007.

A. Itri, et al., "Analysis of Phase-Transformation Dynamics and Estimation . . . ," 42nd Annual International Reliability Physics Symposium, pp. 209-215, Phoenix, Arizona, 2004.

R. Street, et al., "States in the Gap in Glassy Semiconductors," Physical Review Letters, vol. 35, No. 19, pp. 1293-1296, Nov. 10, 1975.

M. Kastner, et al., "Valence-Alternation Model for Localized Gap States in . . . ," Physical Review Letters, vol. 37, No. 22, pp. 1504-1507, Nov. 29, 1976.

* cited by examiner

MULTIPLE LEVEL CELL PHASE-CHANGE MEMORY DEVICE HAVING PRE-READING OPERATION RESISTANCE DRIFT RECOVERY, MEMORY SYSTEMS EMPLOYING SUCH DEVICES AND METHODS OF READING MEMORY DEVICES

RELATED APPLICATIONS

This application claims priority under 35 U.S.C. 119 to Korean Patent Application No. 2007-42046 filed on Apr. 30, 2007, the content of which is incorporated herein by reference in its entirety.

This application is related to U.S. Ser. No. 12/079,886, filed of even date herewith, entitled "Multiple-Level Cell Phase-Change Memory Devices Having Controlled Resistance Drift Parameter, Memory Systems Employing Such Devices, and Method of Reading Memory Devices," by Chang-Wook Jeong, et al., and commonly owned with the present application, the content of which is incorporated herein by reference.

This application is related to U.S. Ser. No. 12/079,892, filed of even date herewith, entitled "Multiple-Level Cell Phase-Change Memory Devices Having Post-Programming Operation Resistance Drift Saturation, Memory Systems Employing Such Devices, and Method of Reading Memory Devices," by Chang-Wook Jeong, et al., and commonly owned with the present application, the content of which is incorporated herein by reference.

BACKGROUND OF THE INVENTION

A phase-change memory or phase-change random access memory (PRAM) as referred to herein is also referred to as an ovonic unified memory (OUM) in the art. The OUM cell is based on a volume of chalcogenide alloy, which, after being heated and cooled, adopts one of two stable, but programmable, phases: crystalline or amorphous. The resistance of the first phase, i.e., the crystalline phase, is relatively low, and the resistance of the second phase, i.e., the amorphous phase, is relatively high. A programming of the state of the cell to a logical one (1) or zero (0) depends on the phase of the programmable volume, and is determined by measuring its resistance. The crystalline, or conductive, state is commonly referred to as the "set", or "0", state; and the amorphous or resistive non-conductive state is commonly referred to as the "reset", or "1", state.

To make the programmable volume amorphous, it is heated above its melting point by a resistive heater. To make the programmable volume crystalline, it is heated to just below its melting point for a short period of time, e.g., 50 ns, so that the atoms line up in their crystalline locations. The volume cools rapidly into the stable amorphous or stable crystalline states when the heater is turned off. In this manner, data is written to the cell by programming the cell to either the crystalline or amorphous states. Reading of the programmed cell is performed by a sense amplifier measuring the resistance of the programmed cell.

The key to the phase-change memory is the chalcogenide material. The device historically includes an alloy of germanium (Ge), antimony (Sb) and tellurium (Te), which is referred to commonly as a GST alloy. The material is particularly useful for incorporation in a memory device because of its ability to switch rapidly, when heated and cooled, between the stable amorphous and crystalline phases.

A memory cell that incorporates a chalcogenide material typically includes a top electrode, a patterned layer, or volume, of the chalcogenide material, and a lower electrode that serves as a resistive heating element. FIG. 1 is a schematic diagram illustrating a memory cell 10 which uses the programmable chalcogenide material. The cell 10 includes a conductive top electrode 12 formed over the programmable phase change chalcogenide material 14. A conductive bottom electrode contact (BEC) 16 is formed under the programmable material 14. The bottom electrode contact (BEC) is formed of a higher resistivity material such as TiAlN, TiN, and the like, so that is operates as a resistive heater by generating heat when current flows through the BEC. An access transistor 20 (see FIGS. 2A and 2B) is connected to the bottom electrode contact 16 for controlling the flow of current through the cell 10. The gate of the access transistor 20 is commonly connected to a word line WL of the memory device incorporating the cell 10.

FIGS. 2A and 2B are schematic diagrams which illustrate the cell 10 in each of the two programmed states. In FIG. 2A, the cell 10 is shown in the conductive set, or "0", state. In this state, some portion of the programmable material 14 in contact with the BEC is in the crystalline state. In FIG. 2B, the cell 10 is shown in the resistive reset, or "1", state. In this state, some portion of the programmable material 14 in contact with the BEC is in the amorphous state.

FIG. 3 is a schematic diagram schematically illustrating the electrical configuration of the cell 10. A word line WL controls the flow of current through the cell 10 at the gate of access transistor 20. The resulting current flowing through the cell 10, $I_{CELL}$, and activation of the bit line BL connected to the top electrode 12 of the cell 10 serves to program the state of the cell 10 during a writing, or programming operation, and serves as a parameter for reading the state of the cell 10 during a reading, or sensing, operation.

FIG. 4 is a timing diagram illustrating programming of a memory cell that includes a volume of programmable chalcogenide material, for example of the type illustrated and described above in connection with FIGS. 1-3. The timing diagram of FIG. 4 is a graph of temperature with respect to time illustrating the programming pulses of heat used in conventional apparatus for programming the material to the set (crystalline) state and the reset (amorphous) state. The curve labeled 22 illustrates the time-temperature relationship for the reset pulse, i.e., the temperature pulse used to program the material to the reset (amorphous) state; and the curve labeled 24 illustrates the time-temperature relationship for the set pulse, i.e., the temperature pulse used to program the material to the set (crystalline) state.

Referring to the curve labeled 22 in FIG. 4, to change the programmable volume of chalcogenide material to the amorphous phase (reset state), the chalcogenide alloy is heated to a temperature above its melting point (Tm), by a resistive heater. The heating pulse is applied for a relatively short period of time, e.g., a few nanoseconds. The alloy cools rapidly when the heater is turned off over a time period T1, referred to as a quenching period, to a temperature that is below the crystallization temperature Tc of the volume. Following the quenching period, the volume of chalcogenide material is placed in a stable, amorphous state.

Referring to the curve labeled 24 in FIG. 4, to change the programmable volume to the crystalline phase (set state), the alloy is heated to a temperature below its melting point Tm, for example, to a temperate between the crystallization temperature Tc and the melting temperature Tm of the material, by the resistive heater. The temperature is maintained for a time period T2 that is relatively longer than the time period T1 to allow portions of the alloy to crystallize, that is, to allow the atoms in the material to align in their crystalline structure. The alloy cools rapidly when the heater is turned off, to a temperature that is below the crystallization temperature Tc of the volume. After the crystallization is achieved, the set heating pulse is removed, and the material cools to a stable, crystalline state.

Research has been conducted toward the fabrication of PRAM devices that have multiple programmable states. For example, while the above examples demonstrate PRAM cells having two states, namely amorphous (reset) and crystalline (set), others have experimented with PRAM cells having multiple so-called "hybrid", or "intermediate", states between the amorphous and crystalline "end" states. In the intermediate states, the programmable volume is partially amorphous and partially crystalline, and by controlling the relative percentages of amorphous and crystalline volumes of programmable material, the resulting resistance of the cell can be controlled. In this manner, each resulting PRAM cell can be said to have multiple programmable states, or multiple levels, each corresponding to a unique resistance value. Research in the field of multiple-level PRAMs has been conducted by Itri, et al., "Analysis of phase-transformation dynamics and estimation of amorphous-chalcogenide fraction in phase-change memories," IEEE $42^{nd}$ Annual International Reliability Physics Symposium, Phoenix, 2004, pp 209-215, the content of which is incorporated herein by reference.

Others have determined that the resistance value of a programmed chalcogenide volume can vary with time. See, for example, Pirovano, et al., "Low-Field Amorphous State Resistance and Threshold Voltage Drift in Chalcogenide Materials," IEEE Transactions on Electron Devices, Vol. 51, No. 5, May 2004, pp 714-719, the content of which is incorporated herein by reference. The resulting "resistance drift" is especially significant in the amorphous state of a two-level PRAM cell, and in the partially amorphous intermediate states and the fully amorphous state of the multiple-level PRAM cell.

In an attempt to control resistance drift, others have studied the behavior of resistance drift dynamics. See, for example, Ielmini, et al., "Recovery and Drift Dynamics of Resistance and Threshold Voltages in Phase-Change Memories," IEEE Transactions on Electron Devices, Vol. 54, No. 2, February 2007, pp 308-315, the content of which is incorporated herein by reference. However, resistance drift remains a difficult problem to address, especially in multiple-level PRAM devices.

SUMMARY OF THE INVENTION

Embodiments of the present invention are directed to multiple level cell phase-change memory devices, memory systems employing such devices and methods of reading memory devices, wherein resistance drift of a device selected for reading is controlled by modifying the resistance of the cell just prior to its being read in order to return the resistance of the cell to near its initial resistance prior to the read operation. In one embodiment, a heating pulse of energy is applied to the cell within about 100 ns prior to the reading operation. Such heating of the cell just prior to reading recovers the resistance level of the cell to near its pre-drift resistance value. In another embodiment, the cell is a multiple-level memory cell.

In one aspect, a memory device, comprises: a plurality of memory cells, each memory cell comprising a memory cell material that has an initial resistance that is determined in response to an applied programming current in a programming operation, the resistance of the memory cell varying from the initial resistance over a time period following the programming operation, and each memory cell being connected to a conduction line of the memory device that is used to apply the programming current to program the resistance of the corresponding memory cell in the programming operation and that is used to apply a read current to read the resistance of the corresponding memory cell in a read operation. A modification circuit modifies the resistance of a memory cell of the plurality of memory cells selected for a read operation to return its resistance to near the initial resistance prior to a read operation of the memory cell.

In one embodiment, the memory cell material comprises a chalcogenide material.

In another embodiment, each memory cell further comprises a heating element in thermal communication with the corresponding memory cell material of the memory cell, the heating element receiving the programming current to heat the corresponding memory cell so that the memory cell material has the initial resistance.

In another embodiment, the heating element comprises an electrode in contact with the corresponding memory cell material, the heating element comprising a resistive material that generates heat when current flows through the heating element.

In another embodiment, each memory cell is programmed by the programming operation to occupy one of a plurality of states, each state including a range of resistances that are independent of neighboring resistance ranges of neighboring states.

wherein the memory cell is programmed by the programming operation to occupy more than two states.

In another embodiment, a low state of the plurality of states corresponds to a state having a lowest range of resistances, a high state of the plurality of states corresponds to a state having a highest range of resistances, and at least one intermediate state of the plurality of states corresponds to at least one state having a range of resistances greater than the lowest range of resistances of the low state and less than the highest range of resistances of the high state.

In another embodiment, the modification circuit modifies the resistance of the memory cell by applying a pulse of energy to the conduction line prior to a read operation of the memory cell, and wherein the modification circuit applies the pulse of energy when the memory cell is programmed by the programming operation to the intermediate state and the modification circuit does not apply the pulse of energy when the memory cell is programmed by the programming operation to the low state or the high state.

In another embodiment, the conduction line comprises a bit line and wherein the modification circuit modifies the resistance of the memory cell by applying a pulse of energy to the bit line prior to a read operation of the memory cell.

In another embodiment, the pulse of energy is applied by a sense amplifier circuit coupled to the bit line.

In another embodiment, the pulse of energy is generated by a control circuit of the memory device and activated by a clamping transistor of the sense amplifier circuit.

In another embodiment, the pulse of energy is applied by a write driver circuit coupled to the bit line.

In another embodiment, the pulse of energy is generated by a control circuit of the memory device and is activated by a switching circuit in the write driver circuit.

In another embodiment, the pulse of energy is applied to the bit line during a precharge operation of the memory cell, wherein the bit line is precharged prior to application of the pulse of energy.

In another aspect, a method of reading a memory device, the memory device comprising a plurality of memory cells, each memory cell comprising a memory cell material that has an initial resistance that is determined in response to an applied programming current in a programming operation, the resistance of the memory cell varying from the initial resistance over a time period following the programming operation, each memory cell being connected to a conduction line of the memory device that is used to apply the programming current to program the resistance of the corresponding memory cell in the programming operation and that is used to apply a read current to read the resistance of the corresponding memory cell in a read operation, comprises: modifying the resistance of a memory cell selected for a read operation to return its resistance to near the initial resistance prior to a read operation of the memory cell; and performing a read operation of the memory cell.

In one embodiment, the memory cell material comprises a chalcogenide material.

In another embodiment, each memory cell further comprises a heating element in thermal communication with the corresponding memory cell material of the memory cell, and the method further comprises applying the programming current to the heating element to heat the corresponding memory cell so that the memory cell material has the initial resistance.

In another embodiment, each memory cell is programmed by the programming operation to occupy one of a plurality of states, each state including a range of resistances that are independent of neighboring resistance ranges of neighboring states, wherein the initial resistance of a memory cell occupies an initial state following the programming operation and wherein modifying the resistance of a memory cell selected for a read operation to return its resistance to near the initial resistance prior to a read operation of the memory cell returns the resistance of the memory cell to a resistance within a range of resistances that corresponds to the initial state.

In another embodiment, the memory cell is programmed by the programming operation to occupy more than two states.

In another embodiment, a low state of the plurality of states corresponds to a state having a lowest range of resistances, a high state of the plurality of states corresponds to a state having a highest range of resistances, and at least one intermediate state of the plurality of states corresponds to at least one state having a range of resistances greater than the lowest range of resistances of the low state and less than the highest range of resistances of the high state.

In another embodiment, modifying the resistance of the memory cell is performed when the memory cell is programmed by the programming operation to the intermediate state and is not performed when the memory cell is programmed by the programming operation to the low state or the high state.

In another embodiment, modifying the resistance comprises modifying the resistance of the memory cell by applying a pulse of energy to a bit line of the memory device connected to the memory cell prior to a read operation of the memory cell.

In another embodiment, the pulse of energy is applied within about 100 ns prior to applying the read current for performing the read operation of the memory cell.

In another embodiment, the pulse of energy is applied to the bit line during a precharge operation of the memory cell, wherein the bit line is precharged prior to application of the pulse of energy.

In another aspect, a method of reading a memory device, the memory device comprising a plurality of memory cells, each memory cell comprising a chalcogenide material that has an initial defect state that is determined in response to an applied programming current in a programming operation, the defect state of the memory cell varying from the initial defect state over a time period following the programming operation, each memory cell being connected to a conduction line of the memory device that is used to apply the programming current to program the defect state of the corresponding memory cell in the programming operation and that is used to apply a read current to read the defect state of the corresponding memory cell in a read operation, comprises modifying the defect state of a memory cell selected for a read operation to return its defect state to near the initial defect state prior to a read operation of the memory cell; and performing a read operation of the memory cell.

In another aspect, an electronic device includes a memory system, the memory system comprising: a memory controller that is arranged to connect to a data bus at which data signals are transferred; and a memory device connected to the memory controller that stores and retrieves the data signals. The memory device comprises: a plurality of memory cells, each memory cell comprising a memory cell material that has an initial resistance that is determined in response to an applied programming current in a programming operation, the resistance of the memory cell varying from the initial resistance over a time period following the programming operation, and each memory cell being connected to a conduction line of the memory device that is used to apply the programming current to program the resistance of the corresponding memory cell in the programming operation and that is used to apply a read current to read the resistance of the corresponding memory cell in a read operation. A modification circuit modifies the resistance of a memory cell of the plurality of memory cells selected for a read operation to return its resistance to near the initial resistance prior to a read operation of the memory cell.

In one embodiment, the memory cell material comprises a chalcogenide material.

In another embodiment, each memory cell further comprises a heating element in thermal communication with the corresponding memory cell material of the memory cell, the heating element receiving the programming current to heat the corresponding memory cell so that the memory cell material has the initial resistance.

In another embodiment, the heating element comprises an electrode in contact with the corresponding memory cell material, the heating element comprising a resistive material that generates heat when current flows through the heating element.

In another embodiment, each memory cell is programmed by the programming operation to occupy one of a plurality of states, each state including a range of resistances that are independent of neighboring resistance ranges of neighboring states.
wherein the memory cell is programmed by the programming operation to occupy more than two states.

In another embodiment, a low state of the plurality of states corresponds to a state having a lowest range of resistances, a high state of the plurality of states corresponds to a state having a highest range of resistances, and at least one intermediate state of the plurality of states corresponds to at least one state having a range of resistances greater than the lowest range of resistances of the low state and less than the highest range of resistances of the high state.

In another embodiment, the modification circuit modifies the resistance of the memory cell by applying a pulse of energy to the conduction line prior to a read operation of the memory cell, and wherein the modification circuit applies the pulse of energy when the memory cell is programmed by the programming operation to the intermediate state and the modification circuit does not apply the pulse of energy when the memory cell is programmed by the programming operation to the low state or the high state.

In another embodiment, the conduction line comprises a bit line and wherein the modification circuit modifies the resistance of the memory cell by applying a pulse of energy to the bit line prior to a read operation of the memory cell.

In another embodiment, the pulse of energy is applied by a sense amplifier circuit coupled to the bit line.

In another embodiment, the pulse of energy is generated by a control circuit of the memory device and activated by a clamping transistor of the sense amplifier circuit.

In another embodiment, the pulse of energy is applied by a write driver circuit coupled to the bit line.

In another embodiment, the pulse of energy is generated by a control circuit of the memory device and is activated by a switching circuit in the write driver circuit.

In another embodiment, the pulse of energy is applied to the bit line during a precharge operation of the memory cell, wherein the bit line is precharged prior to application of the pulse of energy.

BRIEF DESCRIPTION OF THE DRAWINGS

The foregoing and other objects, features and advantages of the embodiments of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DETAILED DESCRIPTION OF EMBODIMENTS

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 1:
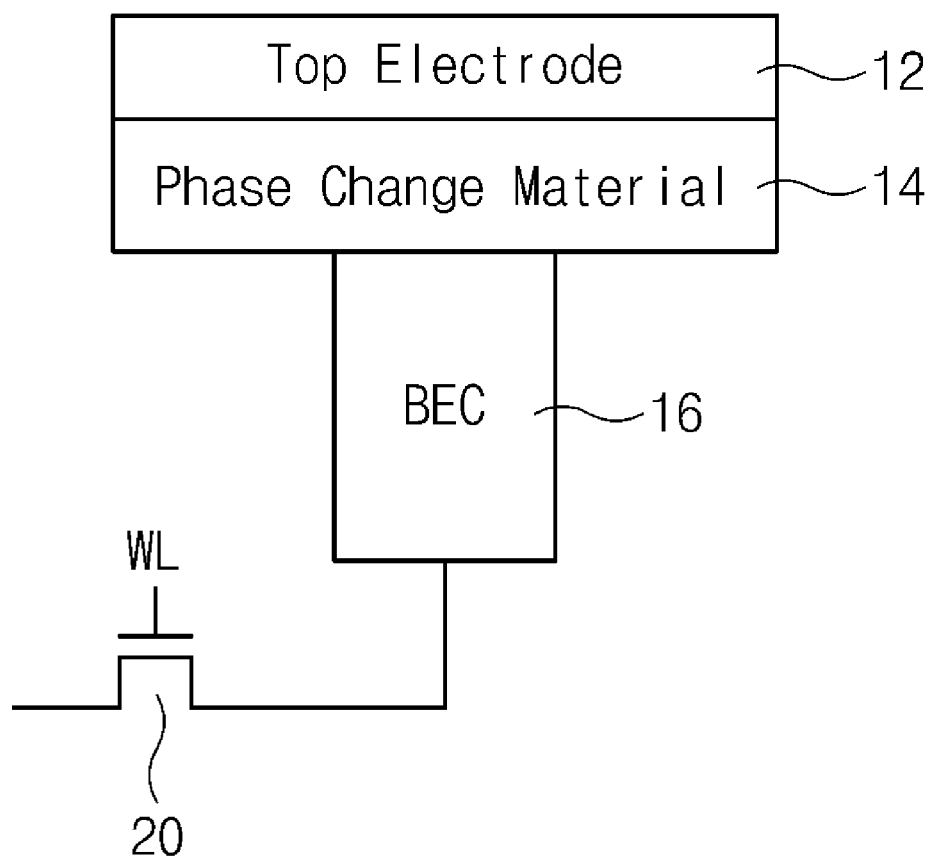
FIG. 1 is a schematic diagram that illustrates a conventional memory cell that employs a programmable chalcogenide material.
Figure 2A:
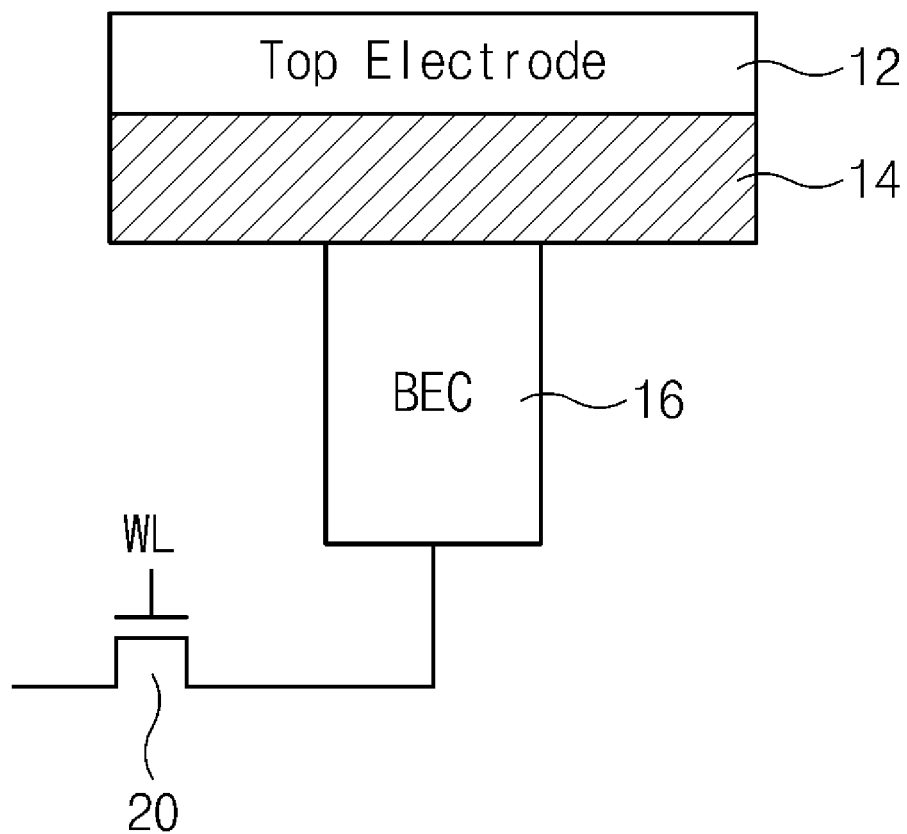
FIGS. 2A and 2B are schematic diagrams that illustrate the conventional memory cell in each of two programmed states.
Figure 2B:
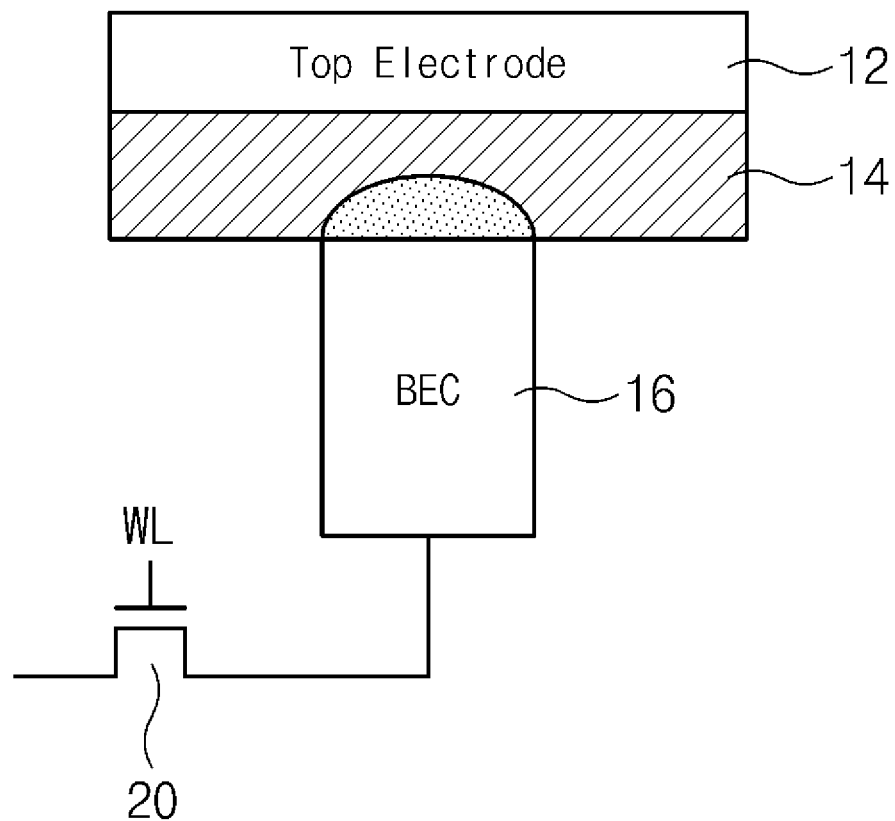
Figure 3:
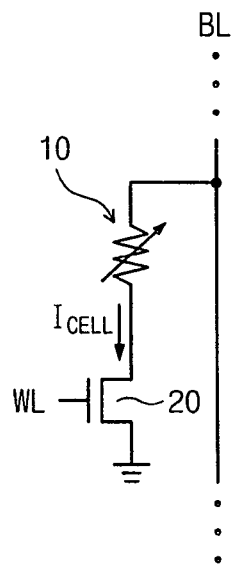
FIG. 3 is an equivalent circuit diagram of the conventional memory cell of FIGS. 1, 2A and 2B.
Figure 4:
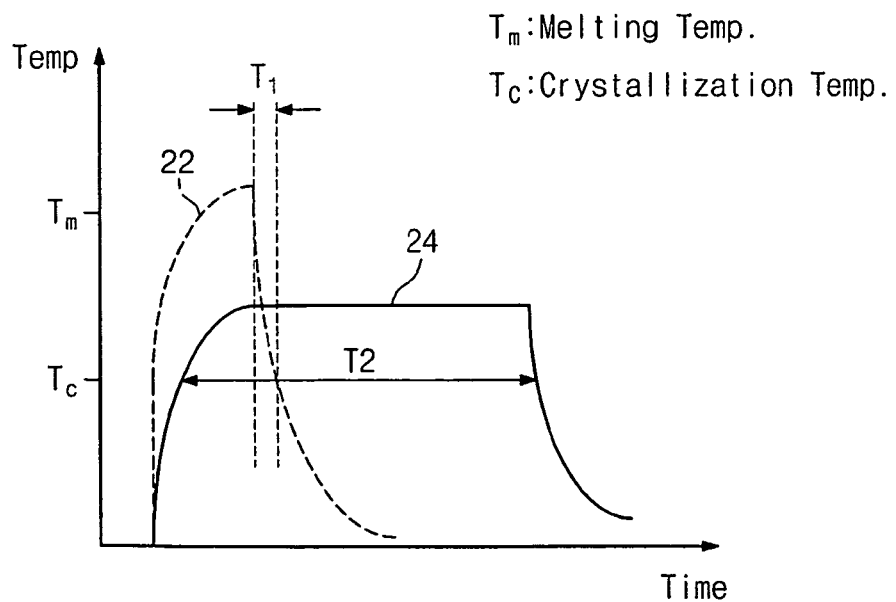
FIG. 4 is a timing diagram illustrating programming of a memory cell that includes a programmable chalcogenide material.
Figure 5A:
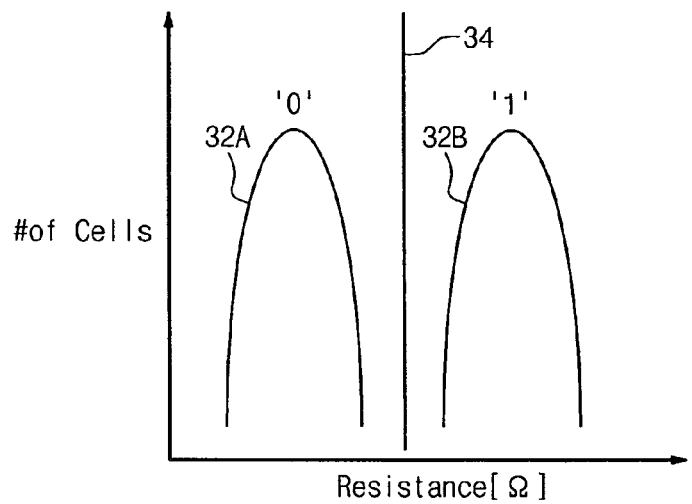
FIG. 5A is a conceptual chart of the partitioning of resistance values into two distinct states for a two-level cell.
Figure 5B:
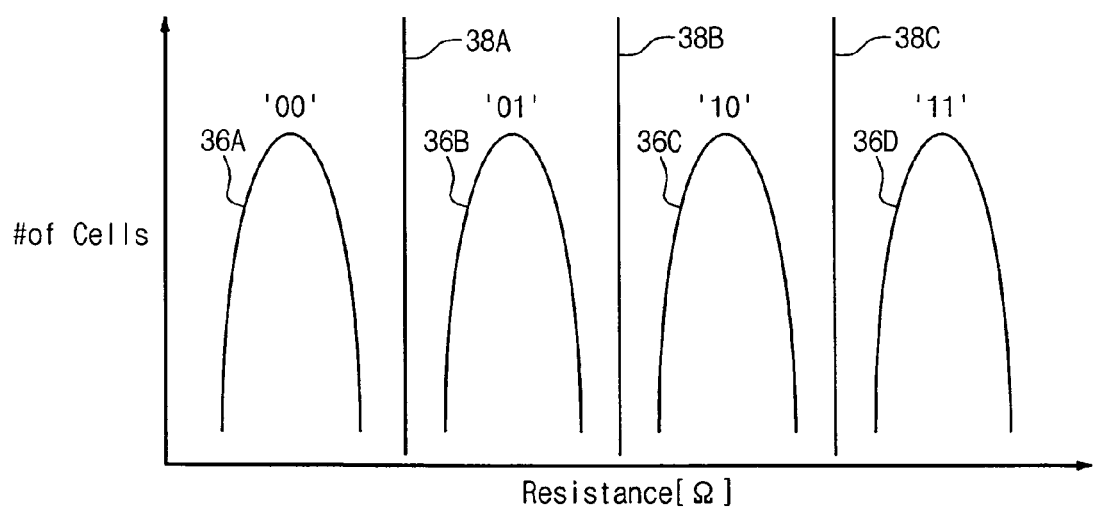
FIG. 5B is a conceptual chart of the partitioning of resistance values into multiple distinct states for a multiple-level cell, in this case, a four-level cell.
Figure 5C:
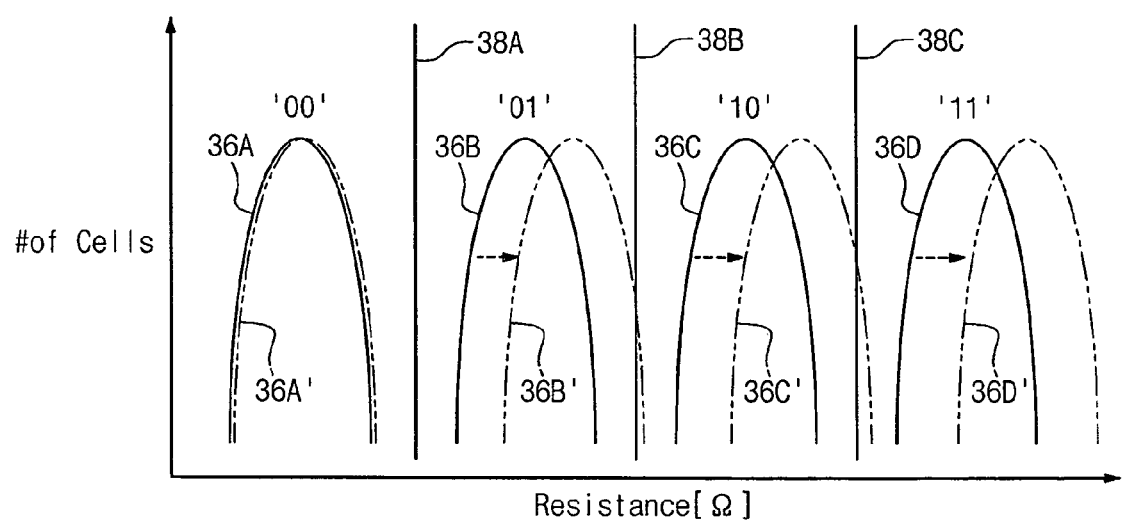
FIG. 5C is a conceptual chart of the partitioning of resistance values into multiple distinct states for the multiple level cell of FIG. 5B, illustrating the effects of resistance drift.

FIG. 5A is a conceptual chart of the partitioning of resistance values into two distinct states for a two-level phase-change memory cell; FIG. 5B is a conceptual chart of the partitioning of resistance values into multiple distinct states for a multiple-level phase-change memory cell, in this case, a four-level cell; and FIG. 5C is a conceptual chart of the partitioning of resistance values into multiple distinct states for the multiple level phase-change memory cell of FIG. 5B, illustrating the effects of resistance drift.

Referring to FIG. 5A, the states of a standard, two-level, phase-change memory cell are depicted. Such two-level cells are referred to in the art as "single-level" cells. Following programming of the cell, a distribution of resulting resistance values can fall into one of two states "0" and "1". Any resistance values of the programmed cell that fall into the range of a first distribution curve 32A are determined as a "0" state, and any resistance values of the programmed cell that fall into the range of a second distribution curve 32B are determined as a "1" state. In this case, the resistance values corresponding to the first and second distribution curves 32A, 32B are readily separable by a boundary resistance value 34; that is, if the determined resistance value is less than the boundary value 34 it is considered to correspond to the "0" state, and if the determined resistance value is greater than the boundary value 34 it is considered to correspond to the "1" state.

Referring to FIG. 5B, the states of a four-level phase-change memory cell are depicted. Following programming of the cell, resulting resistance values can fall into one of four states "00", "01", "10" and "11". The "00" and "11" states are referred to herein as "end states" since they correspond to resistance values at the lower and upper ends of the range of resistance values. The "00" end state corresponds to the crystalline state of the cell and the "11" end state corresponds to the amorphous state of the cell. The "01" and "10" states correspond to intermediate, partially-amorphous states of the cell, with the "01" state corresponding to the cell being programmed to have relatively less amorphous material and the "10" state corresponding to the cell have relatively more amorphous material. Multiple-level cells are beneficial to system integration, since more than two states can be programmed into a single cell. While the "00" and "11" states are referred to herein as corresponding to "crystalline" and "amorphous" states, respectively, such end states of the device do not necessarily correspond to "fully crystalline" and "fully amorphous" states, wherein the volume of programmable material is fully crystalline or fully amorphous. Rather, such end states can equally correspond to states that are partially crystalline and partially amorphous, as in the intermediate states, with, the "00" end state being primarily crystalline, that is containing more crystalline material than the other states, and the "11" end state being primarily amorphous, that is containing more amorphous material than the other states.

Any resistance values of the programmed cell that fall into the range of a first distribution curve 36A are determined as a "00" state, any resistance values of the programmed cell that fall into the range of a second distribution curve 36B are determined as a "01" state, any resistance values of the programmed cell that fall into the range of a third distribution curve 36C are determined as a "10" state, and any resistance values of the programmed cell that fall into the range of a fourth distribution curve 36D are determined as a "11" state. In this case, the resistance values corresponding to the first and fourth distribution curves 36A, 36D belonging to the end states "00" and "11" are readily separated from neighboring distribution curves 36B, 36C by corresponding boundary resistance values 38A, 38C. For example, if the determined resistance value is less than the boundary value 38A, it is considered to correspond to the "00" state, and if the determined resistance value is greater than the boundary value 38C it is considered to correspond to the "11" state. However, the resistance values of the second and third distribution curves 36B, 36C belonging to the intermediate states "01" and "10" are much more susceptible to the resistance drift phenomenon. This increased susceptibility is illustrated in FIG. 5C.

Referring to FIG. 5C, the effects of resistance drift on the distribution curves 36A, 36B, 36C, 36D corresponding to the four states "00", "01", "10", "11" can be seen. After a time period, the resistance values corresponding to pre-drift distribution curve 36A drift, due to the transitioning of unstable defects in the chemical lattice of the programmable volume to more stable defects, causing the curve to shift to a post-drift distribution curve 36A'. Similarly, the resistance values corresponding to pre-drift distribution curve 36B drift, causing the curve to shift to a post-drift distribution curve 36B'; the resistance values corresponding to pre-drift distribution curve 36C drift, causing the curve to shift to a post-drift distribution curve 36C'; and the resistance values corresponding to pre-drift distribution curve 36D drift, causing the curve to shift to a post-drift distribution curve 36D'.

In FIG. 5C it can be seen that post-drift distribution curve 36A' has drifted a relatively small amount, relative to its pre-drift distribution curve 36A. This is because the resistance values associated with the first distribution curve 36A are a result of the programmable volume containing relatively more, or being completely formed of, crystallized material. Since the lattice of crystallized material contains relatively fewer unstable defects than a corresponding lattice of amorphous material, the crystallized material will experience relatively less resistance drift. It can also be seen in FIG. 5C that the second, third and fourth post-drift distribution curves 36B', 36C', 36D' have drifted a relatively large amount, relative to their pre-drift distribution curves 36B, 36C, 36D. The amount of resistance drift generally increases along with increased amorphous content in the programmed volume of material.

In the case of the two-level cell (see FIG. 5A), resistance drift can be more readily managed, because the resistance values corresponding to the two states "0" and "1" can be made to be substantially separated from each other by selection of an appropriate boundary resistance value 34, so that, even after the occurrence of substantial resistance drift over long time periods, the resulting port-drift resistance value of the amorphous state "1" is still above the boundary resistance value 34, and the resulting post-drift resistance value of the crystalline state "0" is still below the boundary resistance value 34. Because only two states are needed, resistance drift is not a primary concern in the standard, two-level cell.

In the case of the multiple-level cell, having states such as those depicted in FIGS. 5B and 5C, management of resistance drift is significant. For the "00" and "11" end states, resistance drift can be readily managed by setting appropriate boundary values 38A, 38C. For example, if boundary value 38A is selected to clearly define the resistance values corresponding to the first distribution curve 36A, which is known to be less susceptible to resistance drift, then management of resistance drift for the end state "00" can be readily managed. Similarly, if boundary value 38C is selected to greatly exceed the highest of the predicted resulting post-drift resistance values corresponding to the third distribution curve 36C', then all resulting resistance values higher than this boundary value 38C can be determined to correspond to the end state "11", irrespective of the amount of resistance drift experienced by resistance values pertaining to the fourth post-drift distribution curve 36D'.

However, for the "01" and "01" intermediate states, in this example, management of the resistance drift is required. For example, resistance drift of the second pre-drift distribution curve 36B results in the second post-drift distribution curve 36B' crossing the pre-defined boundary value 38B separating the second and third, intermediate states "01" and "10". Similarly, resistance drift of the third pre-drift distribution curve 36C results in the third post-drift distribution curve 36C' crossing the pre-defined boundary value 38C separating the third state, namely intermediate states "01", and the fourth state, namely end state "11". Without proper management of the resistance drift phenomenon, it can be seen that improper state determinations can occur during a subsequent read operation of the memory cell.

The mechanism behind the resistance drift phenomenon is well-described in the Pirovano, et al. paper cited above. Resistance drift naturally occurs due to the presence of certain defect structures in the chemical matrix of the chalcogenide programmable volume upon programming. Over time, the defects, which are initially unstable (such as unstable $C_3^0$ structures, where C represents the chalcogenide atom), transition to more stable structures (such as relatively stable $C_3^+$ and $C_1^-$ structures), according to the chemical relationship:

$$2C_3^0 \rightarrow C_3^+ + C_1^- \quad (1)$$

The density of unstable defects has a direct effect on the resistance of the programmable volume; therefore, the resulting resistance of the programmable volume of material is varied. Such unstable defects are less common, i.e. they are of lower density, in the crystallized state, which is why resistance drift is less significant for a device programmed into the crystallized state than it is for a device programmed to have a percentage of amorphous material.

Embodiments of the present invention, including multiple level cell phase-change memory devices, memory systems employing such devices and methods of reading memory devices, manage resistance drift of a memory cell selected for reading by modifying the resistance of the cell just prior to the reading operation in order to return the resistance of the cell to near its initial resistance, that is, near its initial programmed resistance, just prior to the read operation. This operates to revert the density of the unstable defects in the material to near post-programming, pre-drift, value. In one embodiment, a pulse of energy is applied to the cell within about 100 ns prior to the reading operation in order to heat the cell to accomplish such recovery of the resistance values.

Figure 6A:
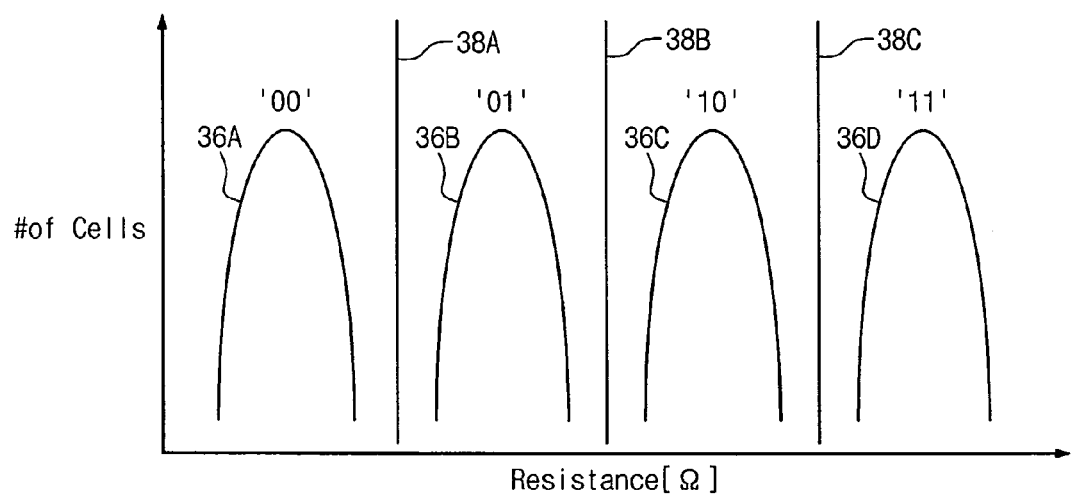
FIGS. 6A, 6B and 6C illustrate the effect of the management of resistance drift prior to a read operation, in accordance with embodiments of the present invention.
Figure 6B:
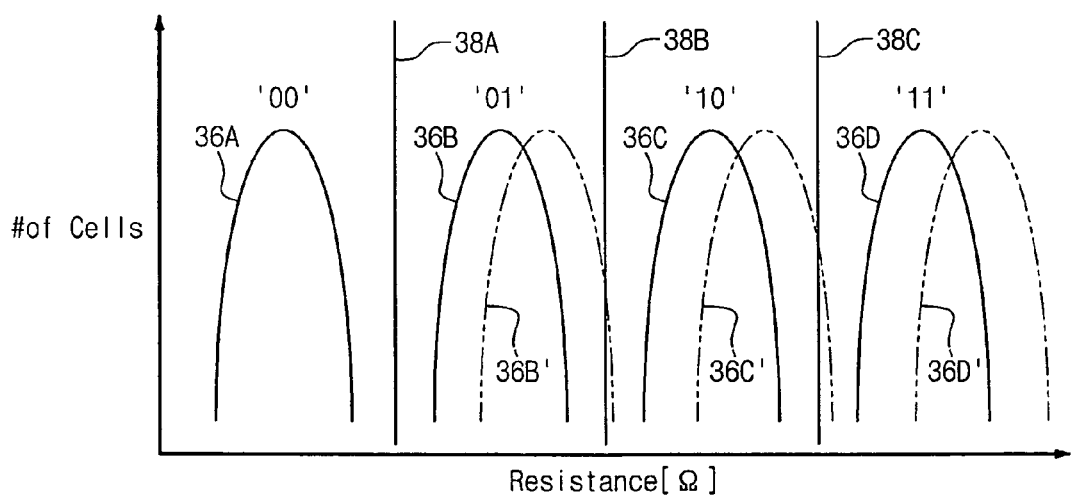
Figure 6C:
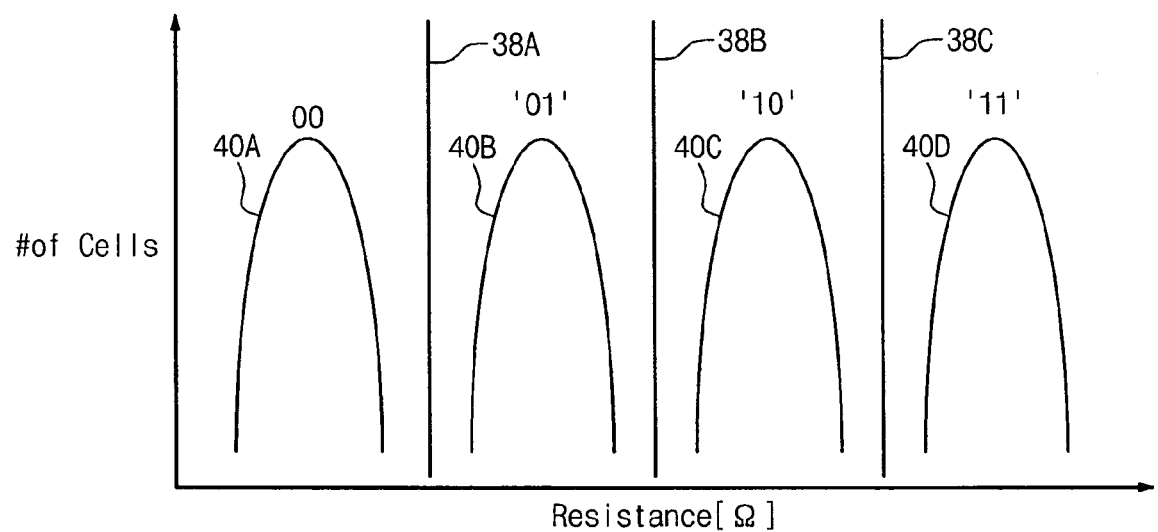

The effect of the management of resistance drift in this manner is illustrated in FIGS. 6A-6C, which correspond to the four-level cell example illustrated above in FIGS. 5B and 5C. Referring to FIG. 6A, the possible states of the cell are illustrated immediately following programming of the cell. First through fourth states are possible "00", "01", "10" and "11", with each of the four states corresponding to a first through fourth respective distribution curve 36A, 36B, 36C, 36D of resistance values. The states are separated by resistance boundary values 38A, 38B, 38C, as described above. At this time, immediately following programming, the chemical lattice of the programmable volume contains a relatively high concentration of unstable defects. For this reason, the programmable volume can be considered to occupy a first metastable state.

Referring to FIG. 6B, in time, a natural resistance drift can occur as a result of the transitioning of unstable defects to more stable defects, as described above, so that the second, third and fourth pre-drift distribution curves 36B, 36C, 36D can become shifted to second, third and fourth post-drift distribution curves 36B', 36C', 36D', leading to the problems described above. During this time, the programmable volume can be considered to occupy a stable state.

Referring to FIG. 6C, to compensate for the resistance drift, just prior to the read operation, an electrical pulse is applied to the cell in order to apply energy to the volume of programmable material in the cell. The resulting pulse operates to recover the cell to nearly its initial resistance value. For example, the second, third and fourth post-drift resistance distribution curves 36B', 36C', 36D' are immediately shifted to lower resistance values that correspond to recovered second, third and fourth resistance distribution curves 40B, 40C, 40D. Similarly, to the extent that the first pre-drift resistance distribution curve 36A was subject to resistance drift, it too can be returned to a recovered first resistance distribution curve 40A more near to its initial value. The resulting first, second, third, and fourth distribution curves 40A, 40B, 40C, 40D are well-defined between the originally defined resistance boundary values 38A, 38B, 38C, so that a read operation of the cell will achieve reliable results. The pulse may operate to reduce the number of stable defects, to cause many, or all, of them to revert back to their original, post-programming state, so that the density of stable defects is reduced and the density of unstable defects is increased. At this time, just prior to a read operation, the programmable volume can be considered to occupy a second metastable state.

In certain embodiments, delivery of the electrical pulse to the multiple-level memory cell to cause resistance recovery is performed by a circuit that is connected to a bit line of the cell. In one example embodiment, this operation is performed by a reading circuit, or sense amplifier, that is connected to the bit line of the memory cell. In another example, the operation is performed by a write driver circuit that is connected to a bit line of the memory cell. Other configurations for delivering an electrical pulse to the memory cell just prior to a read operation are equally applicable to the principles of the embodiments of the present invention.

Figure 7:
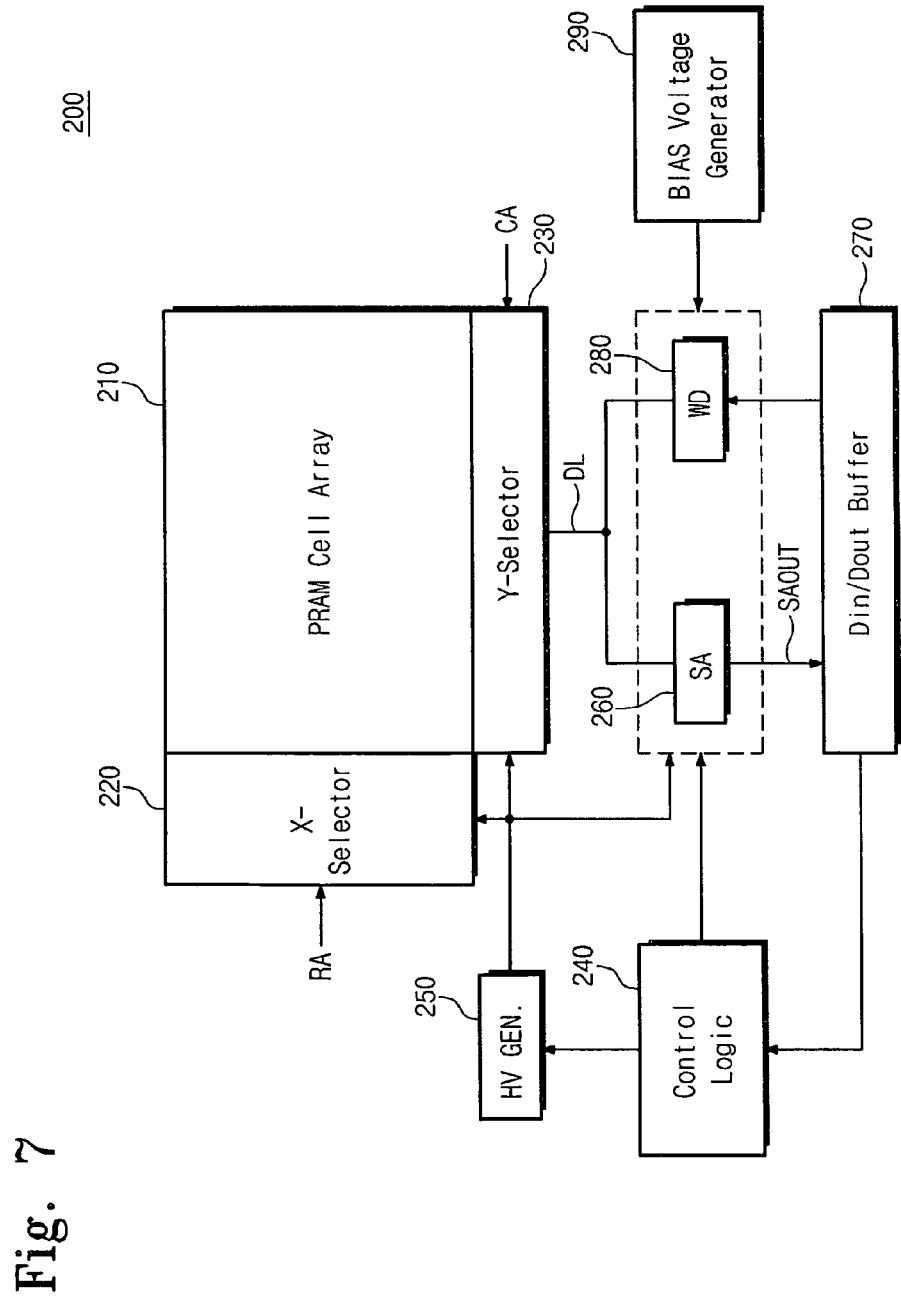
FIG. 7 is a block diagram of a memory device including a PRAM cell array, in accordance with an embodiment of the present invention.

FIG. 7 is a block diagram of a memory device 200 including a PRAM cell array 210 containing a plurality multiple-level phase-change programmable memory cells in accordance with an embodiment of the present invention. The PRAM cell array includes an X-selector circuit 220 and Y-selector circuit 230 in accordance with standard memory device configurations. The X-selector circuit 220, also referred to as a row decoder, receives a row address RA signal, and the Y-selector circuit, also referred to as a column decoder, receives a column address CA signal.

Referring to FIG. 7, a phase change memory device 200 according to the present embodiment includes a memory cell array 210 that stores N-bit data (where N is 2 or more). A plurality of memory cells are arranged within the memory cell array 210 in rows (for example, along word lines) and columns (for example, along bit lines). Each memory cell may consist of a switching element and a resistance element. A switching element may be formed of various elements such as MOS transistors, diodes, and the like. A resistance element may be configured to include a phase-change film that includes the above-described GST material. Each memory cell may be an writable memory cell. Exemplary resistance elements are disclosed in U.S. Pat. Nos. 6,928,022, 6,967,865 and 6,982,913, the content of each being incorporated herein by reference in its entirety.

Continuing to refer to FIG. 7, a row selector circuit 220 is configured to select one of the rows (or word lines) in response to a row address RA signal, and a column selector circuit 230 is configured to select certain columns (or bit lines) in response to a column address CA signal. Control logic 240 is configured to control the overall operation of the multi-level phase change memory device 200 in response to an external read/write command. A high voltage generator circuit 250 is controlled by the control logic 240 and is configured to generate a high voltage that is used for the row and column selector circuits 220 and 230, a sense amplifier circuit 260, and a write driver circuit 280. For example, the high voltage generator circuit 250 may be implemented using a charge pump. It would be apparent to one skilled in the art that implementation of the high voltage generator circuit 250 is not limited to the embodiments described herein.

The sense amplifier circuit 260 is controlled by the control logic 240, and is configured to sense cell data via columns (or bit lines) selected by the column selector circuit 230. The sensed data SAOUT may be externally output via a data input/output buffer circuit 270. The sense amplifier circuit 260 is connected to a data bus DL, and is configured to supply sensing current I_SENSE to the data bus DL at a read operation. The write driver circuit 280 is controlled by the control logic 240, and is configured to supply write current to the data line DL according to data provided via the input/output buffer circuit 270. A bias voltage generator circuit 290 is controlled by the control logic 240, and is configured to generate bias voltages to be supplied to the sense amplifier circuit 260 and the write driver circuit 280.

In accordance with the multi-level phase change memory device embodiments of the present invention, in particular, the control logic 240 can control the sense amplifier circuit 260 and/or the write driver circuit 280 so as to supply a recovery current pulse to selected memory cells prior to a sense operation, in order to prevent read error due to resistance drift. In exemplary embodiments, the amount of the recovery current may be determined such that the initial resistance values of respective data states are recovered after supplying the recovery current pulse. A resistance value of a resistance element in each of selected memory cells may be recovered to its initial resistance value (i.e., a resistance value that is initially determined when the cell is programmed or a resistance value before resistance drift occurs) by supplying the recovery current to the selected memory cells, just prior to a read operation of the cells. This operation is referred to herein as a "recovery operation". Following such a recovery operation, it is possible to precisely sense multi-level data from selected memory cells by supplying a sensing current to the selected memory cells.

Figure 8A:
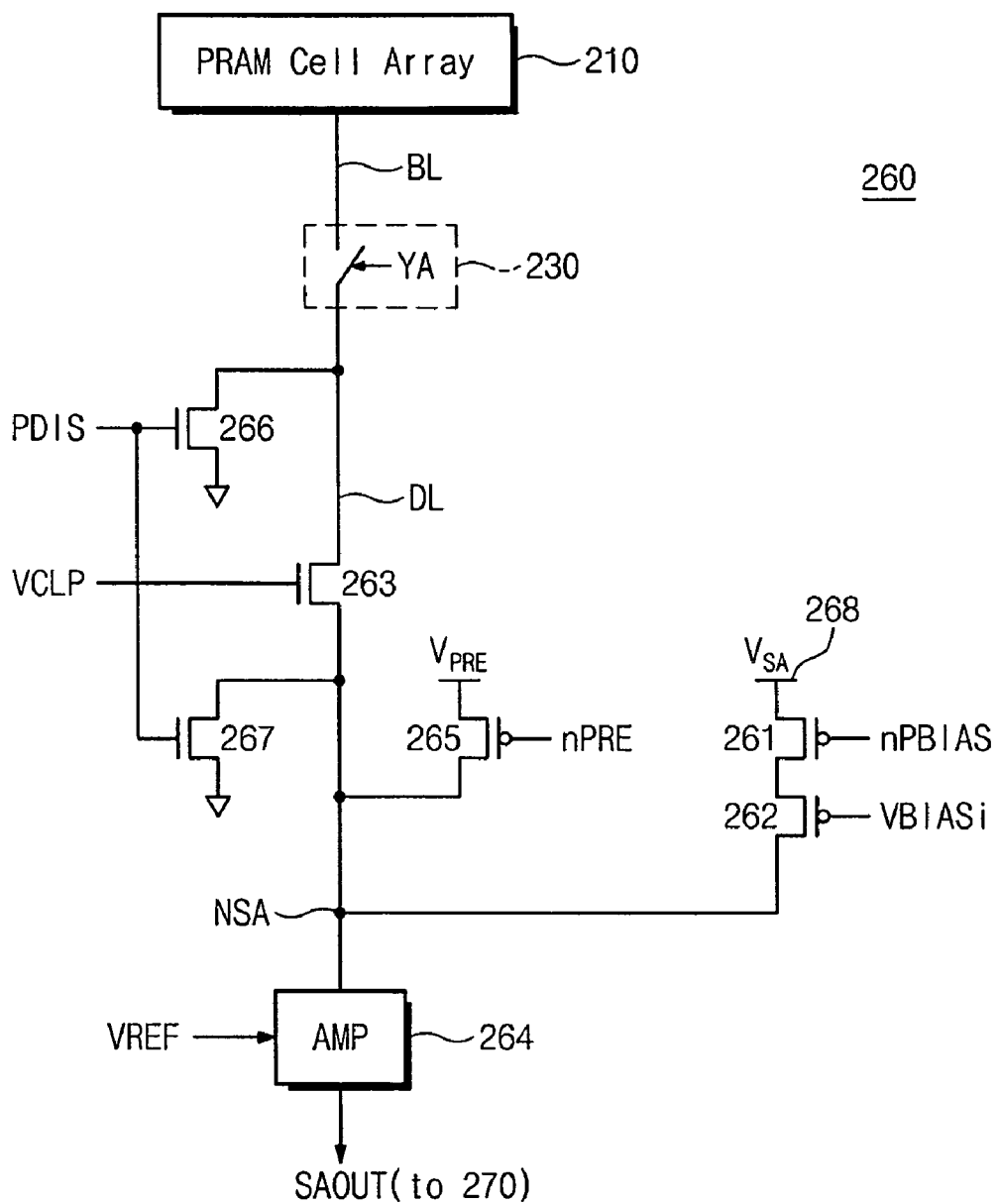
FIG. 8A is a schematic circuit diagram of an embodiment of the sense amplifier of the memory device of FIG. 7, in accordance with an embodiment of the present invention.

FIG. 8A is a schematic circuit diagram of an embodiment of the sense amplifier SA 260 of the memory device of FIG. 7, in accordance with an embodiment of the present invention. In FIG. 8A it can be seen that each memory cell in a column of the PRAM cell array 210 is connected to a common bit line BL, which in turn is selectively coupled to a data line DL of the memory device 200 by the Y-selector circuit 230.

A clamping transistor 263, in this example an NMOS transistor, is connected between the data line DL and a sensing node NSA of a sense amplifier 264. A gate of the clamping transistor 263 receives a clamping control signal VCLP. The clamping transistor 263 operates to cause the data line DL, and connected bit line BL to have a voltage level that is appropriate for a read operation of the memory cell.

The sense amplifier 264 compares the voltage of the sensing node NSA with a reference voltage Vref to provide the output signal SAOUT to the data buffer 270.

A precharge transistor 265, in this case a PMOS transistor, is connected between the precharge voltage level Vpre and the sensing node NSA. A gate of the precharge transistor 265 is connected to a precharge control signal nPRE to precharge the sensing node NSA to the precharge voltage level Vpre during a precharge mode.

Although only a single sense amplifier circuit corresponding to a single bit line is illustrated in FIG. 8A, it will be apparent to those skilled in the art that additional sense amplifier circuits are further provided to correspond to the bit organization of the device. For example, in a case of bit organization for the device being ×8, eight sense amplifier circuits can be employed. In the case of bit organization for the device being ×16, sixteen sense amplifier circuits can be employed. The number of sense amplifier circuits required is however not necessarily equal to the bit organization number of the device.

Referring to FIG. 8A, in this example, a sense amplifier circuit 260 according to the present invention includes PMOS transistors 261, 262 and 265, NMOS transistors 263, 266 and 267, and a sense amplifier 264. The PMOS transistors 261 and 262 are serially connected between a power terminal 268 and the sensing node NSA at the input terminal of the sense amplifier 264. A power supply voltage VCC, or a voltage $V_{SA}$ that is greater than VCC, may be applied to the power terminal 268. Herein, the $V_{SA}$ voltage may be a voltage higher than a power supply voltage by a threshold voltage of a diode; however, it would be apparent to one skilled in the art that the $V_{SA}$ voltage is not necessarily limited in this manner. The PMOS transistor 261 is turned on/off in response to a control signal nPBAIS indicating a sense period, and the PMOS transistor 262 is turned on/off in response to a bias voltage VBIASi (i=1~3). The control signal nPBAIS can be provided from the control logic 240 of FIG. 7, and the bias voltage VBIASi can be provided from the bias voltage generator circuit 290 of FIG. 7.

The NMOS clamping transistor 263 is connected between the sensing node NAS and the column selector circuit 230 (or, the data line DL), and is controlled by a clamping control signal or clamping voltage VCLP so as to limit the voltage of the bit line BL or limit the current applied to the bit line BL. The clamp voltage VCLP operates to maintain the voltage of a bit line to a level that is below a threshold voltage at which the reset state of the corresponding phase change material volume can be changed, and to supply the recovery current pulse, for example greater in amount than the sensing current, to a bit line during a recovery period. The sense amplifier 264 senses via the column selector circuit 230 whether a voltage present on a bit line BL is lower or higher than a reference voltage VREF, and outputs the sensed result to the data input/output buffer circuit 270.

In one example, the sense amplifier 264 can be configured to sense whether a memory cell is programmed to occupy one of two states. Alternatively, the sense amplifier 264 can be configured to sense whether a memory cell is programmed to occupy one of multiple (greater than two) states. It will be apparent to one skilled in the art that the structure of the sense amplifier 264 can be configured appropriately to sense in accordance with the number of programmable states in a multiple-level PRAM configuration.

The PMOS precharge transistor 265 is connected between a pre-charge voltage $V_{PRE}$ and the sensing node NSA, and is controlled in response to a precharge control signal nPRE, for example as generated by the control logic 240 of FIG. 7. The NMOS transistor 266 is connected between the column selector circuit 230, i.e., the data line DL, and a ground voltage, and is controlled in response to a control signal PDIS, for example, as generated by the control logic 240 of FIG. 7. The NMOS transistor 267 is connected between the sensing node NSA and a ground voltage, and is controlled in response to the control signal PDIS. The PMOS transistors 261 and 262 may constitute a sensing current supplying part that supplies to the sensing node NSA, that is, a bit line BL, the amount of current determined by the bias voltage VBIASi or the sensing current I_SENSE during the sensing period. The sensing current I_SENSE may be supplied to a memory cell via a bit line during the sensing period. The PMOS transistor 265 may constitute a pre-charge current supplying part that supplies pre-charge current to the signal line NSA during a pre-charge period. The clamping control signal VCLP applied to the NMOS clamping transistor 263 may constitute first and second clamping voltages so as to supply a pre-charge current and a recovery current to a bit line prior to a sensing operation. The first clamp voltage is lower than the second clamping voltage and higher than a ground voltage, and will be described in further detail below.

It has been determined that application of the recovery pulse in the clamping control signal VCLP is preferably set to have a duration of about 10 ns-10 µs, and an amplitude of about Vth−0.3 volts to about Vth+0.1 volts, where Vth is determined as the threshold voltage of a multiple-level memory cell having the end state corresponding to the highest resistance value, for example end state "11" in the example of FIG. 6 above. In general GND<V1<V2<Vth. In addition, it has been determined that the application of the recovery pulse should precede the reading operation by no more than 100 ns, for effective reading of the memory cell following recovery of the resistance drift.

Figure 8B:
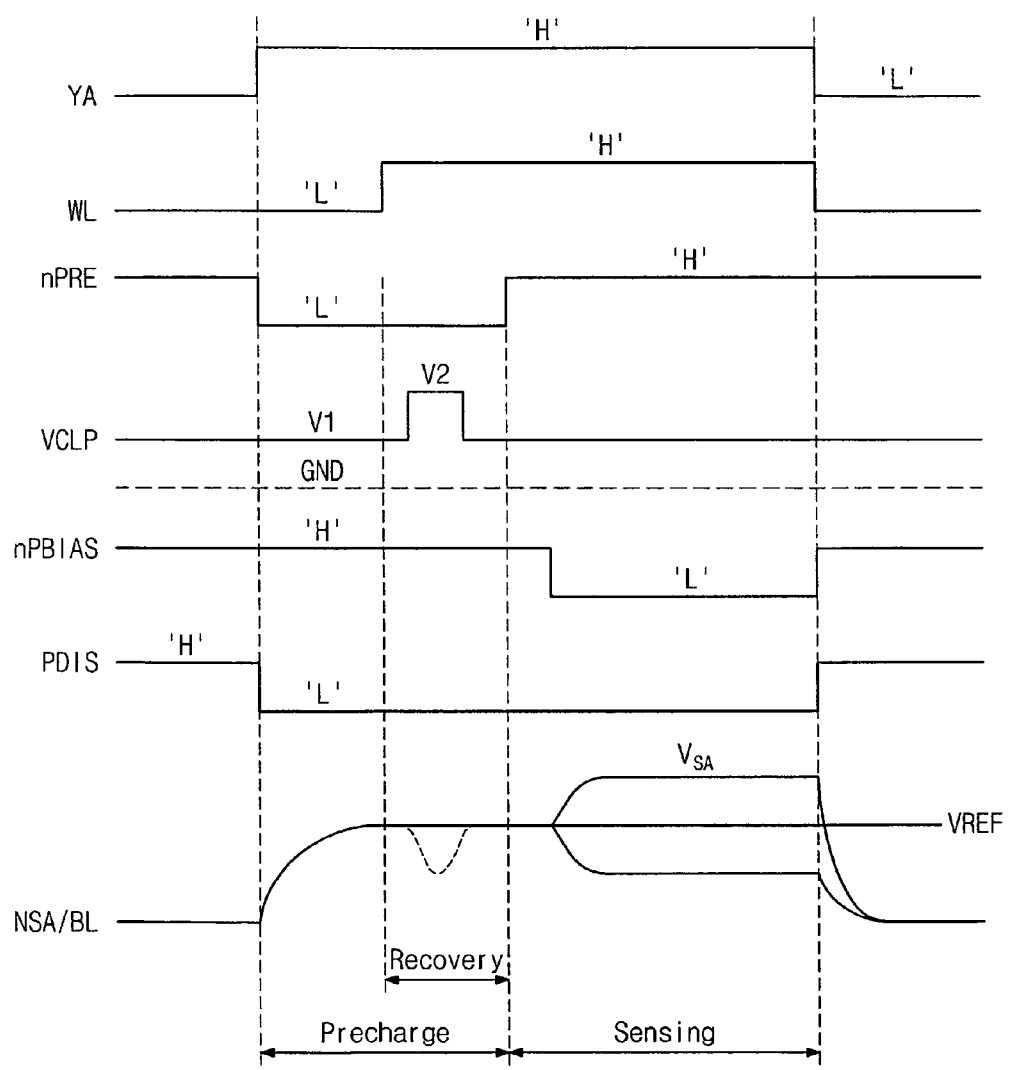
FIG. 8B is a timing diagram illustrating the operation of the sense amplifier of FIG. 8A, in accordance with an embodiment of the present invention.
Figure 9:
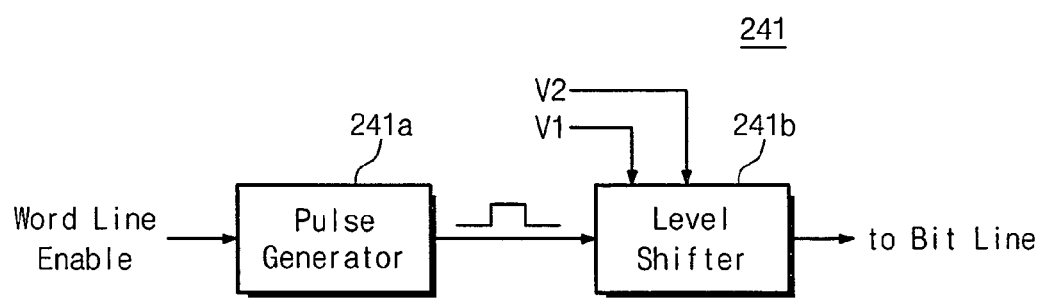
FIG. 9 is a block diagram of an embodiment of the control logic circuit of the memory device of FIG. 7, in accordance with an embodiment of the present invention.

FIG. 9 is a detailed block diagram of the control logic circuit 240 of FIG. 7 above, including a clamp voltage generating circuit 241, in accordance with an embodiment of the present invention. Referring to FIG. 9, a clamp voltage generating circuit 241 can include a pulse generator 241a and a level shifter 241b. The pulse generator 241a is configured to generate a pulse signal in response to word line enable signal. The level shifter 241b operates responsive to an output of the pulse generator 241a and is supplied with a first clamp voltage level V1 and a second clamp voltage level V2. In one embodiment, the level shifter 241b outputs a clamping control signal VCLP having the first clamp voltage level V1 when an output of the pulse generator 241a has a low level and outputs a clamping control signal VCLP having the second clamp voltage level V2 when an output of the pulse generator 241a has a high level. The clamping control signal VCLP can be applied to a gate of the NMOS clamping transistor 263 of the sense amplifier circuit 260 of FIG. 8A, in accordance with the operation illustrated in FIG. 8B. This example is merely illustrative of a mechanism for applying an appropriate pulse signal to the NMOS clamping transistor 263 of the sense amplifier 260. Other suitable mechanisms are equally applicable to the principals of the present disclosure.

FIG. 8B is a timing diagram illustrating the operation of the sense amplifier 260 of FIG. 8A during a read operation, in accordance with an embodiment of the present invention.

Prior to describing a read operation, it should be noted that a sensing operation to be described below can be carried out a single time, or more times, depending on the coding manner of the multiple states. In accordance with embodiments of the invention, a recovery operation can be performed a single time prior to a first sensing operation, irrespective of the number of sensing operations to be performed. Alternatively, a recovery operation can be performed prior to each sensing operation. For the convenience of description, a read operation of a multi-level phase change memory device will be described as comprising a single recovery operation prior to a single sensing operation.

A read operation of a multi-level phase change memory device according to embodiments of the present invention can include a pre-charge period and a sensing period. Before a bit line/sensing node BL/NSA is pre-charged, that is, before a pre-charge period, control signals PDIS and nPBIAS have a high level, and a control signal nPRE has a low level. At this time, a clamp voltage VCLP has a first clamp voltage V1 (e.g., 2.2V). With this bias condition, transistors 261, 263 and 265 of a sense amplifier circuit 260 are turned off, while transistors 263, 266 and 267 of the sense amplifier circuit 260 are turned on. This means that the data line DL and sensing node NSA are discharged into a ground voltage.

At the initiation of a read operation of a memory cell of the device, a precharge period is initiated to precharge the bit line BL, data line DL and sensing node NSA to an appropriate voltage level for a read operation. This is initiated by activating the precharge control signal nPRE (by transitioning from "H" to "L" in this example). During the pre-charge period, the control signals nPRE and PDIS have a low level, and the control signal nPBIAS has a high level. The bit line BL is connected to the data line DL by switch 230, as the column select signal YA is activated. At this time, the clamping control signal VCLP is at a first clamp voltage level V1 (e.g., 2.2V) that is greater than a ground voltage level, so that the clamping transistor 263 is activated. Under this bias condition, the data line DL, connected bit line BL, and sensing node NSA are likewise precharged to the appropriate voltage level during the precharge period. In this example, they can be charged to a pre-charge voltage $V_{PRE}$ that is equal to a reference voltage VREF that is applied to the sense amplifier.

During the precharge period, a word line WL becomes activated, and a recovery period is initiated for recovering the resistance level in the programmable volume of the corresponding memory cell to compensate for resistance drift in the memory cell. During this recovery period, the clamping control signal VCLP is pulsed to a second clamp voltage level V2 (e.g., 3.0V) for a time period. Such pulsing of the clamping control signal VCLP is referred to herein as a "recovery pulse". In one embodiment, the second clamp voltage level V2 is greater than the first clamp voltage level V1, and is of a sufficient voltage and time duration so as to cause sufficient current to flow through the memory cell via NMOS clamping transistor 263 to cause recovery of the resistance level of the cell to its pre-drift level. At the same time, the second clamp voltage level V2, is not large enough in amplitude and its duration is insufficient to cause enough current to flow so as to induce phase change in the programmable volume of the memory cell. The precharge control signal nPRE remains activated during the recovery period.

Following the recovery period, a sensing period is initiated. After the clamp voltage VCLP is lowered from the second clamp voltage V2 to the first clamp voltage V1, as illustrated in FIG. 8B, the control signal nPRE transitions from a low level to a high level, and the control signal nPBIAS transitions from a high level to a low level. At this time, an appropriate bias voltage VBIASi is supplied to the PMOS transistor 262. Under this condition, sensing current flowing via the PMOS transistors 261 and 262 is supplied to a bit line BL via the NMOS clamping transistor 263 and the column selector circuit 230. At this time, as illustrated in FIG. 8B, the voltage of the bit line/sensing node BL/NSA may be changed to be greater than or less than a reference voltage VREF in accordance with the programmed state of the memory cell. Voltage variation of the sensing node NSA is sensed via the sense amplifier 264. Sensed data SAOUT is provided to the data input/output buffer circuit 270, to thereby complete the sensing operation.

Figure 10:
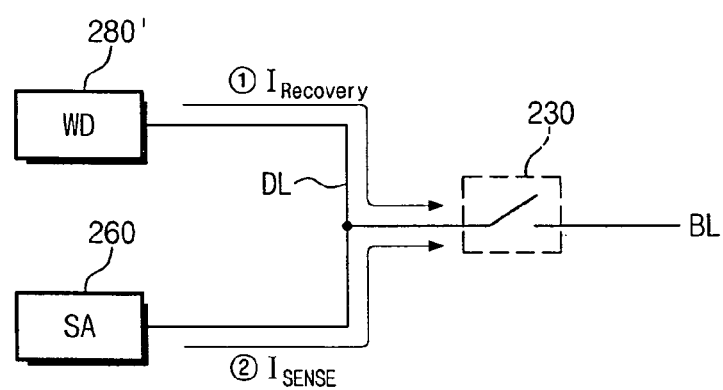
FIG. 10 is a block diagram illustrating the connection of both the sense amplifier and the write driver circuit to the data line of the memory device.

In another example, the resistance-drift-recovery operation is performed by a write driver circuit that is connected to a bit line of the memory cell. Referring to FIG. 10, and with reference to FIG. 7, both a sense amplifier SA 260 and a write driver circuit WD 280 are connected to the data line DL of the memory device 200, in accordance with standard memory device configurations. In the embodiment described above in connection with FIGS. 8A, 8B and 9, the sense amplifier circuit 260 and associated clamp voltage generating circuit 241 are responsible for generating the recovery pulse signal to effect recovery from resistance drift. In the present embodiment of FIG. 10, the sense amplifier circuit 260 is conventional in operation and the write driver circuit WD is responsible for generating the recovery pulse signal. The write driver circuit 280' is modified to accommodate this additional responsibility.

Figure 11A:
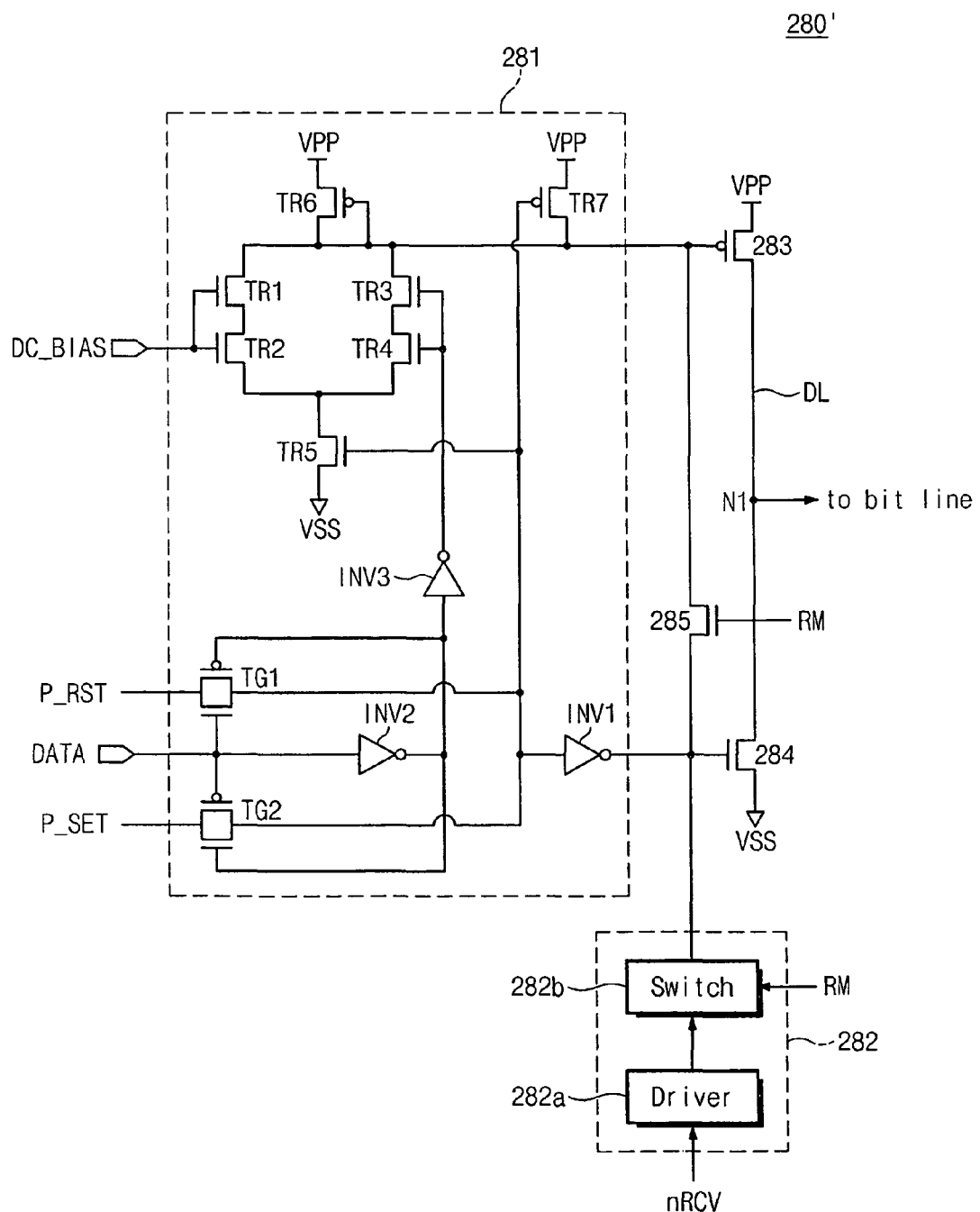
FIG. 11A is a schematic circuit diagram of an embodiment of the write driver circuit of the memory device of FIG. 7, in accordance with another embodiment of the present invention.

FIG. 11A is a schematic circuit diagram of an embodiment of the write driver circuit WD 280' of the memory device of FIG. 7, in accordance with another embodiment of the present invention. In FIGS. 10 and 11A it can be seen that each memory cell in a column of the PRAM cell array 210 is connected to a common bit line BL, which in turn is coupled to the data line DL of the memory device 200 by the Y-selector circuit 230.

Referring to FIG. 11A, the write driver circuit 280' can include a driver controller 281, a selection part 282, a PMOS transistor 283 operating as a pull-up driver, an NMOS transistor 284 operating as a pull-down driver, and an NMOS transistor 285. An exemplary embodiment of the driver controller 281 is disclosed in U.S. Pat. No. 7,012,834, the content of which is incorporated herein by reference, and, accordingly, a detailed description thereof is thus omitted. In particular, in case of the present embodiment, during a read operation, the pull-up driver 283 is controlled, not by a driving signal from the driver controller 281, as would be the case during a writing operation, but rather by a driving signal transferred via the selection part 282. The selection part 282 receives a recovery control signal nRCV, and outputs the recovery control signal nRCV to the pull-up and pull-down drivers 283 and 284 via the NMOS transistor 285 selectively, in accordance with a mode of operation. Herein, the recovery control signal nRCV is a pulsed signal that is configured in accordance with a resistance-drift recovery operation, and can be supplied, for example, by the control logic 240 illustrated in FIG. 5.

Continuing to refer to FIG. 11A, the selection part 282 can include a driver 282a and a switch 282b. The switch 282b connects an output of the driver 282a to gates of the pull-up and pull-down transistors 283 and 284 in response to an operation mode signal RM. In this case, the switch 282b is activated when the operation mode signal RM indicates a read operation and is deactivated when the operation mode signal RM indicates a write operation. The driver 282a drives the pull-up and pull-down transistors 283 and 284 via the switch 282b in response to the recovery control signal nRCV. For example, when the recovery control signal nRCV has a low level, the pull-up transistor 283 is turned off and the pull-down transistor 284 is turned on. On the other hand, when the recovery control signal nRCV has a high level, the pull-up transistor 283 is turned on and the pull-down transistor 284 is turned off. Herein, the pull-up/pull-down driving capacity of the driver 282a may be set to be larger than that of a PMOS transistor TR7 and an inverter INV1 of the driver controller 281.

As in the above-described embodiment, the active pulse of the recovery control signal nRCV may be set to have a duration of about 10 ns-10 μs, and an amplitude of about Vth−0.3 volts to about Vth+0.1 volts, where Vth is determined as the threshold voltage of a multiple-level memory cell having the end state corresponding to the highest resistance value, for example end state "11" in the example of FIG. 6 above.

In this manner, the write driver circuit 280' is configured to be connected to a data line DL to perform normal write-driving utilities during a write operation, but also is connected to the data line DL for the purpose of supplying the recovery control signal nRCV during a read operation. It would be apparent to one skilled in the art that electric interconnection between a data line and a write driver circuit is not limited to the configuration described above, and other configurations for connecting the write driver circuit 280' to the data line DL during a read operation for the purpose of supplying the recovery control signal nRCV as a pulse signal for restoring the resistance-drift of the programmable volume are equally applicable to the embodiments of the present disclosure.

Figure 11B:
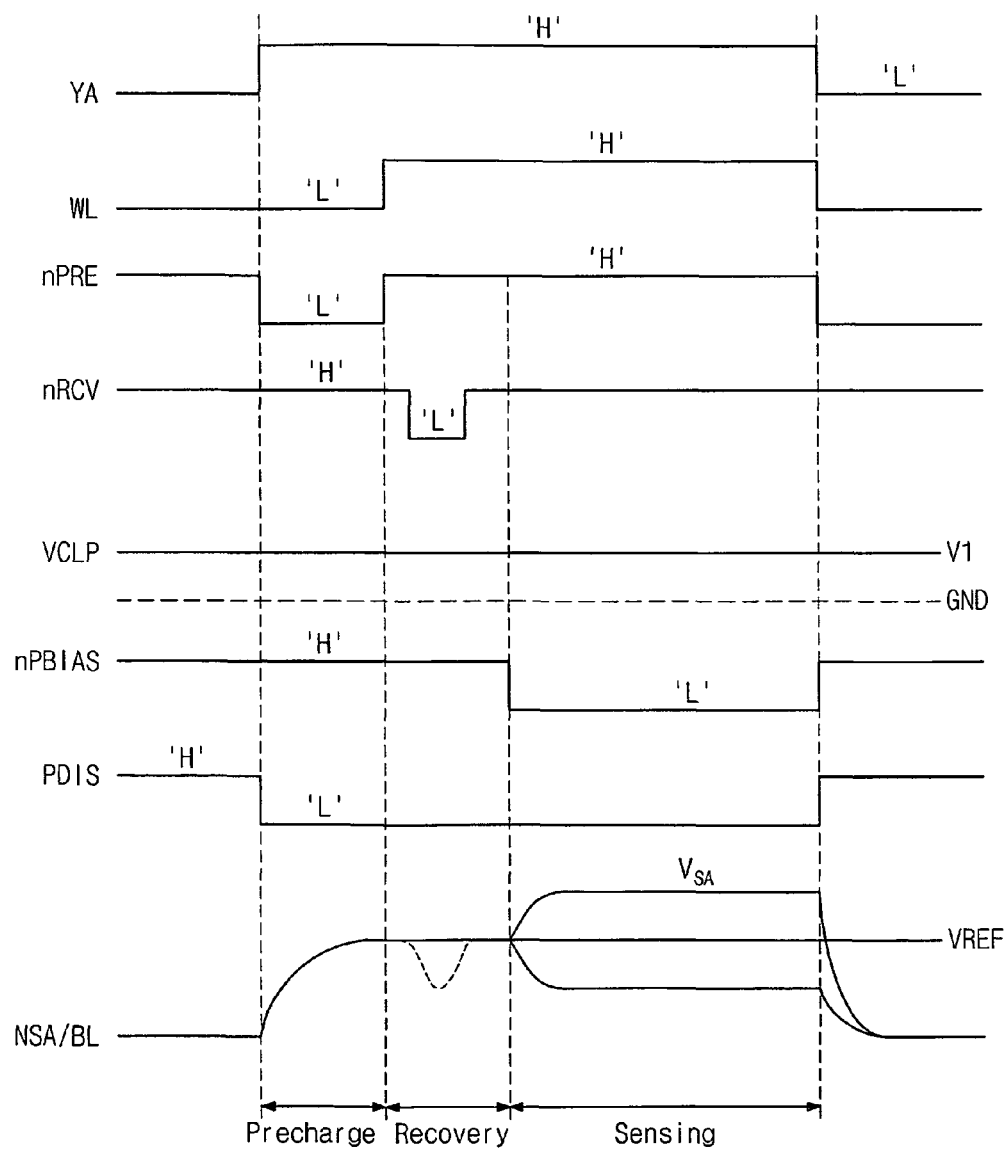
FIG. 11B is a timing diagram illustrating the operation of the write driver circuit and sense amplifier circuit of FIGS. 10 and 11A, in accordance with an embodiment of the present invention.

FIG. 11B is a timing diagram illustrating the operation of the sense amplifier 260 and write driver circuit of FIGS. 10 and 11A during a read operation. As described above, at the initiation of a read operation of a memory cell of the device, a precharge period is initiated to precharge the sensing node NSA to an appropriate voltage level for a read operation. This is initiated by activating the precharge control signal nPRE. At this time, the clamping control signal VCLP is at a first clamp voltage level V1 that is greater than a ground voltage level, so that the clamping transistor 263 is activated. The clamping control signal VCLP remains at this first clamp voltage level V1 for the duration of the read operation. As a result, the data line DL, and connected bit line BL are likewise precharged to the appropriate voltage level during the precharge period.

Following the precharge period, a word line WL becomes activated, and a recovery period is initiated for recovering the resistance level in the programmable volume of the corresponding memory cell to compensate for resistance drift in the memory cell. During this recovery period, the recovery control signal nRCV is pulsed to a low voltage level for a time period. Such pulsing of the recovery control signal nRCV is referred to herein as a "recovery pulse". The control signal nRCV is applied to the pull-up driver 283 of FIG. 11A via a selection part 282 of a write driver circuit 280'. That is, recovery current pulse is supplied to a selected bit line BL via the pull-up driver 283. As the recovery current is supplied to a selected bit line BL via the pull-up driver 283, the resistance level of the corresponding resistance element of the memory cell may be recovered to an initial resistance value. After the recovery current pulse is supplied to a selected bit line for a given time, the control signal nRCV returns from the low level to the high level, which deactivates the pull-up driver 283 to be turned off, and the recovery operation is complete.

Following the recovery period, a sensing period is initiated, and normal operation of the sense amplifier follows for determining the resistance of the programmable volume in the memory cell, and therefore, the state of the memory cell.

Figure 12:
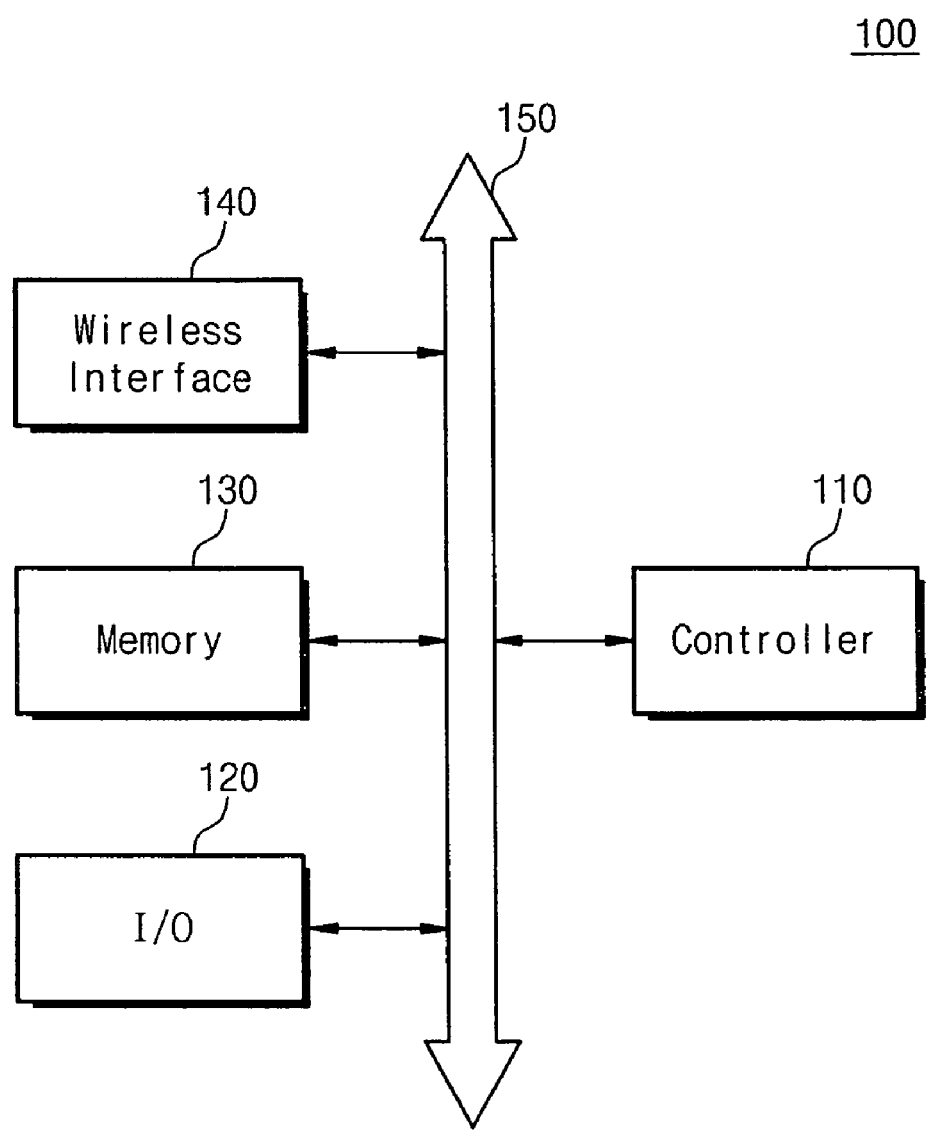
FIG. 12 is a block diagram of an electronic device including a PRAM cell array containing a plurality of multiple-level phase-change programmable memory cells in accordance with an embodiment of the present invention.

FIG. 12 is a block diagram of an electronic device 100 including a semiconductor device PRAM cell array containing a plurality of multiple-level phase-change programmable memory cells in accordance with an embodiment of the present invention. In various examples, the electronic device 100 can be used as a wireless communication device, i.e., PDA, laptop computer, mobile computer, web tablet, mobile phone, digital music player, or any device configured to transmit and/or receive information in a wireless environment. The electronic device 100 may include an input/output device 120, a memory 130, a wireless interface 140 and a controller 110 that communicate via a bus 150. The controller 110 comprises, for example, at least one of a microprocessor, digital signal processor, or microcontroller. The input/output device 120 may include, for example, a keypad, keyboard and display unit. The memory 130 may be used to store commands executed by the controller 110, or may be used to store user data. The memory 130 may further comprise various kinds of memories. The electronic device 100 may use a wireless interface 140 to receive data from a wireless communication network or to transmit data to the network, for example, through RF signals. The wireless interface 140 can include, for example, an antenna, wireless transceivers, and other necessary equipment for communicating wirelessly. Electronic devices 100 according to the present invention may be used as a communication interface protocol such as third generation communication systems, i.e, CDMA, GSM, NADC, E-TDMA, WCDMA, CDMA2000.

In exemplary embodiments, the programmable volume of a memory cell can comprise a chalcogenide material, for example, consisting of Te, Se, S, a combination thereof, or an alloy thereof. Alternatively, the chalcogenide material can consist of a material obtained by adding an impurity (e.g., Bi, Sr, Si, C, N, O, etc.) to Te, Se, S, a combination thereof, or an alloy thereof. Alternatively, the chalcogenide material can consist of a material selected from a group of Ge, Sb, Sn, As, Si, Pb, Te, Se, S, a combination thereof, and an alloy thereof. Alternatively, the chalcogenide material may consist of a material obtained by adding an impurity (e.g., Bi, Sr, Si, C, N, O, etc.) to one selected from a group of Ge, Sb, Sn, As, Si, Pb, Te, Se, S, a combination thereof, and an alloy thereof.

While the invention has been particularly shown and described with references to preferred embodiments thereof, it will be understood by those skilled in the art that various changes in form and details may be made herein without departing from the spirit and scope of the invention as defined by the appended claims.

For example, while the above-described embodiments depict multiple level cells that are operable in two or four states per cell, other numbers of states are conceivable, and equally applicable to the principles of the present disclosure. For example, a cell can have multiple-level states of a number that is a multiple of two, such as 4, 8, 16, 32, etc. states Also a cell can have other numbers of states that are not multiples of two, such as 3, 5, 6, 7, etc. states.

What is claimed is:

1. A memory device, comprising:
   a plurality of memory cells,
      each memory cell comprising a memory cell material that has an initial resistance that is determined in response to an applied programming current in a programming operation, the resistance of the memory cell varying from the initial resistance over a time period following the programming operation, and
      each memory cell being connected to a conduction line of the memory device that is used to apply the programming current to program the resistance of the corresponding memory cell in the programming operation and that is used to apply a read current to read the resistance of the corresponding memory cell in a read operation; and
   a modification circuit that modifies the resistance of a memory cell of the plurality of memory cells selected for a read operation to return its resistance to near the initial resistance prior to a read operation of the memory cell.

2. The memory device of claim 1 wherein the memory cell material comprises a chalcogenide material.

3. The memory device of claim 1 wherein each memory cell is programmed by the programming operation to occupy one of a plurality of states, each state including a range of resistances that are independent of neighboring resistance ranges of neighboring states,
   wherein the memory cell is programmed by the programming operation to occupy more than two states.

4. The memory device of claim 3 wherein:
   a low state of the plurality of states corresponds to a state having a lowest range of resistances,
   a high state of the plurality of states corresponds to a state having a highest range of resistances, and
   at least one intermediate state of the plurality of states corresponds to at least one state having a range of resistances greater than the lowest range of resistances of the low state and less than the highest range of resistances of the high state.

5. The memory device of claim 4 wherein the modification circuit modifies the resistance of the memory cell by applying a pulse of energy to the conduction line prior to a read operation of the memory cell, and wherein the modification circuit applies the pulse of energy when the memory cell is programmed by the programming operation to the intermediate state and the modification circuit does not apply the pulse of energy when the memory cell is programmed by the programming operation to the low state or the high state.

6. The memory device of claim 1 wherein the conduction line comprises a bit line and wherein the modification circuit modifies the resistance of the memory cell by applying a pulse of energy to the bit line prior to a read operation of the memory cell.

7. The memory device of claim 6 wherein the pulse of energy is applied by a sense amplifier circuit coupled to the bit line.

8. The memory device of claim 7 wherein the pulse of energy is generated by a control circuit of the memory device and activated by a clamping transistor of the sense amplifier circuit.

9. The memory device of claim 8 wherein the pulse of energy is applied by a write driver circuit coupled to the bit line.

10. The memory device of claim 6 wherein the pulse of energy is generated by a control circuit of the memory device and is activated by a switching circuit in the write driver circuit.

11. The memory device of claim 6 wherein the pulse of energy is applied to the bit line during a precharge operation of the memory cell, wherein the bit line is precharged prior to application of the pulse of energy.

* * * * *